United States Patent
Cranmer (10) Patent No.: US 11,314,232 B2
(45) Date of Patent: Apr. 26, 2022

(54) FREQUENCY RESPONSE DIAGNOSTICS FOR CHARACTERIZING SERVO CONTROLLED MECHANISMS

(71) Applicant: Applied Materials, Inc., Santa Clara, CA (US)

(72) Inventor: Adam Christopher Cranmer, Leander, TX (US)

(73) Assignee: Applied Materials, Inc., Santa Clara, CA (US)

( * ) Notice: Subject to any disclaimer, the term of this patent is extended or adjusted under 35 U.S.C. 154(b) by 44 days.

(21) Appl. No.: 16/948,363

(22) Filed: Sep. 15, 2020

(65) Prior Publication Data
US 2022/0083026 A1    Mar. 17, 2022

(51) Int. Cl.
  *G05B 19/4155*   (2006.01)
  *G05D 19/00*     (2006.01)
  *G01R 31/28*     (2006.01)

(52) U.S. Cl.
  CPC ......... *G05B 19/4155* (2013.01); *G05D 19/00* (2013.01); *G01R 31/2837* (2013.01);
  (Continued)

(58) Field of Classification Search
  CPC ...... G05B 19/4155; G05B 2219/31368; G05B 2219/36176; G05B 2219/37605; G05B 2219/39412; G05D 19/00; G01R 31/2837
  See application file for complete search history.

(56) References Cited

U.S. PATENT DOCUMENTS 3,577,050 A * 5/1971 Ringland ............... B60L 50/61
                                                  318/146
3,584,276 A * 6/1971 Ringland ............... H02K 29/12
                                                  318/721

(Continued)

FOREIGN PATENT DOCUMENTS

EP          0817377          1/1996
KR          10-1297755       1/2017

OTHER PUBLICATIONS

PCT Notification of Transmittal of The International Search Report and The Written Opinion of The International Searching Authority for PCT Application No. PCT/US2021/050111, dated Dec. 3, 2021, 8 pages.

*Primary Examiner* — Manuel A Rivera Vargas
*Assistant Examiner* — Yaritza H Perez Bermudez
(74) *Attorney, Agent, or Firm* — Lowenstein Sandler LLP (57) ABSTRACT

A server includes a processor to supply a torque command to an amplifier that controls a motor that drives a linkage; include, in the torque command, an alternating signal wave that is to test a frequency response of the motor and the linkage; receive, from the amplifier, an instantaneous torque value of the motor and an instantaneous mechanical parameter value of the linkage at each time step according to a sampling rate and over a period of time; store an aggregate of both these values; determine, for a first frequency of the alternating signal wave, a magnitude and phase shift between the aggregate of the instantaneous mechanical parameter values and the aggregate of the instantaneous torque values; and generate, using an aggregate of magnitude and phase shift data for multiple frequencies of the alternating signal wave, a fingerprint to be used in performing diagnostics of motor and linkage.

20 Claims, 7 Drawing Sheets

200B

Change a frequency of the alternating signal wave. 240

Repeat operations 220, 225, and 230 for each of the multiple frequencies to generate the aggregate of the magnitude and phase shift data. 245

Store the aggregate of the magnitude and phase shift data in a data structure of the memory. 250

(52) U.S. Cl.
CPC ............ *G05B 2219/31368* (2013.01); *G05B 2219/36176* (2013.01); *G05B 2219/37605* (2013.01); *G05B 2219/39412* (2013.01)

(56) References Cited

U.S. PATENT DOCUMENTS

| | | | | |
|---|---|---|---|---|
| 3,720,863 | A * | 3/1973 | Ringland | B60L 50/13 |
| | | | | 318/52 |
| 3,845,372 | A * | 10/1974 | Ringland | B60L 50/13 |
| | | | | 318/779 |
| 4,131,936 | A * | 12/1978 | Gemp | H02M 7/49 |
| | | | | 363/43 |
| 4,454,426 | A * | 6/1984 | Benson | F02G 1/0435 |
| | | | | 290/1 R |
| 4,484,154 | A * | 11/1984 | Pavin | H03L 7/06 |
| | | | | 327/156 |
| 10,120,374 | B2 * | 11/2018 | Hosek | G06F 11/2257 |
| 10,378,951 | B2 * | 8/2019 | Miklosovic | G01H 1/003 |
| 10,605,701 | B2 * | 3/2020 | Tsuzuki | G01M 99/008 |
| 11,163,272 | B2 * | 11/2021 | Nakajima | G05B 11/42 |
| 11,181,372 | B2 * | 11/2021 | Seshia | G01V 7/005 |
| 2006/0267537 | A1 * | 11/2006 | Baumann | G05B 19/409 |
| | | | | 318/632 |
| 2011/0074330 | A1 * | 3/2011 | Ellis | G05B 13/042 |
| | | | | 318/561 |
| 2012/0053705 | A1 * | 3/2012 | Bensoussan | G05B 5/01 |
| | | | | 700/37 |
| 2016/0018466 | A1 * | 1/2016 | Miklosovic | H02P 23/14 |
| | | | | 702/182 |
| 2018/0001478 | A1 * | 1/2018 | Freeman | B25J 9/0087 |
| 2018/0067086 | A1 * | 3/2018 | Tian | G01N 29/4472 |
| 2020/0190959 | A1 * | 6/2020 | Gooneratne | G08B 21/187 |

* cited by examiner

```
┌─────────────────────────────────────────────────────────────────────────┐
│ Supply a torque command to a triple-loop amplifier that controls a       │
│ motor, wherein the motor drives a robot linkage. 210                     │
└─────────────────────────────────────────────────────────────────────────┘
                                   ↓
┌─────────────────────────────────────────────────────────────────────────┐
│ Include, in the torque command, an alternating signal wave that is to    │
│ test a frequency response of the motor and the robot linkage. 215        │
└─────────────────────────────────────────────────────────────────────────┘
                                   ↓
┌─────────────────────────────────────────────────────────────────────────┐
│ Receive, from the triple-loop amplifier, an instantaneous torque value   │
│ of the motor and an instantaneous mechanical parameter value of the      │
│ robot linkage at each time step of a plurality of time steps according   │
│ to a sampling rate and over a period of time. 220                        │
└─────────────────────────────────────────────────────────────────────────┘
                                   ↓
┌─────────────────────────────────────────────────────────────────────────┐
│ Store, in memory, an aggregate of the instantaneous torque values and    │
│ an aggregate of the instantaneous mechanical parameter values. 225       │
└─────────────────────────────────────────────────────────────────────────┘
                                   ↓
┌─────────────────────────────────────────────────────────────────────────┐
│ Determine, for a first frequency of the alternating signal wave, a       │
│ magnitude and phase shift between the aggregate of the instantaneous     │
│ mechanical parameter values and the aggregate of the instantaneous       │
│ torque values. 230                                                       │
└─────────────────────────────────────────────────────────────────────────┘
                                   ↓
┌─────────────────────────────────────────────────────────────────────────┐
│ Generate a bode plot fingerprint using an aggregate of magnitude and     │
│ phase shift data for multiple frequencies of the alternating signal      │
│ wave, the bode plot fingerprint to be used in performing diagnostics     │
│ of the motor and the robot linkage. 235                                  │
└─────────────────────────────────────────────────────────────────────────┘
```

```
┌─────────────────────────────────────────────────────────────────────────┐
│ Change a frequency of the alternating signal wave. 240                   │
└─────────────────────────────────────────────────────────────────────────┘
                                   ↓
┌─────────────────────────────────────────────────────────────────────────┐
│ Repeat operations 220, 225, and 230 for each of the multiple             │
│ frequencies to generate the aggregate of the magnitude and phase         │
│ shift data. 245                                                          │
└─────────────────────────────────────────────────────────────────────────┘
                                   ↓
┌─────────────────────────────────────────────────────────────────────────┐
│ Store the aggregate of the magnitude and phase shift data in a data      │
│ structure of the memory. 250                                             │
└─────────────────────────────────────────────────────────────────────────┘
```

┌─────────────────────────────────────────────────────────────────────────┐
│ Supply the torque command and the alternating signal wave also to a second amplifier that controls a │
│ second motor, the second motor also to drive the robot linkage. 255 │
└─────────────────────────────────────────────────────────────────────────┘
                                        ↓
┌─────────────────────────────────────────────────────────────────────────┐
│ Receive, from the second amplifier, a second instantaneous torque value of the second motor and a │
│ second instantaneous mechanical parameter value of the robot linkage at each time step of the plurality │
│ of time steps according to the sampling rate and over the period of time. 260 │
└─────────────────────────────────────────────────────────────────────────┘
                                        ↓
┌─────────────────────────────────────────────────────────────────────────┐
│ Store, in the memory, an aggregate of the second instantaneous torque values and an aggregate of the │
│ second instantaneous mechanical parameter values. 265 │
└─────────────────────────────────────────────────────────────────────────┘
                                        ↓
┌─────────────────────────────────────────────────────────────────────────┐
│ Determine, for the first frequency of the alternating signal wave, a second magnitude and phase shift │
│ between the aggregate of the second instantaneous mechanical parameter values and the aggregate of │
│ the second instantaneous torque values. 270 │
└─────────────────────────────────────────────────────────────────────────┘
                                        ↓
┌─────────────────────────────────────────────────────────────────────────┐
│ Use an aggregate of the magnitude and phase shift data and of the second magnitude and phase shift │
│ data, over the multiple frequencies, in performance of frequency response analysis to generate the bode │
│ plot fingerprint. 275 │
└─────────────────────────────────────────────────────────────────────────┘

FREQUENCY RESPONSE DIAGNOSTICS FOR CHARACTERIZING SERVO CONTROLLED MECHANISMS

TECHNICAL FIELD

Embodiments of the present disclosure relate to frequency response diagnostics for characterizing servo controlled mechanisms.

BACKGROUND

Servo controlled mechanisms are commonly used in the manufacturing industries, such as in robotics tools that are employed to automate manufacturing. In some cases, this manufacturing is a multi-step processing of semiconductor devices, in which the robotics tools include motors attached to robot linkages that move semiconductor substrates from step to step of degas (or clean), deposition, and etch processes. The robot linkages, for example, may be arms and end effectors of a robot used for substrate transfer within a factory interface and transfer chamber or the like. The robot linkages may also include one more pulley belt that facilitates transfer of torque between the motor and the arm or other robot linkage.

Defects (or errors) occur in these servo controlled mechanisms, whether in the motor, in a robot linkage driven by the motor, or in a pulley belt that enables the driven force between the motor and the robot linkage. Conventionally, when an actual defect arises or a suspected defect is detected (e.g., through an error), a trained engineer is required to directly connect to and use software running on an amplifier that acts as an actuator to the motor. This direct connection is usually made via a wired connection of a computing device via a Universal Serial Bus (USB) (or other direct) connection, for example. The engineer may run a diagnostic of the robotics tool (or other servo controlled mechanism) via the computing device to diagnose the source of the defect or error. Only a single motor may be tested at one time via this method. Further, tensions of the pulley belts are conventionally verified via a direct physical measurement of the pulley belt, requiring disassembly of a motor stack and robot linkages.

Because of the requirement to make a direct connection to and use of the amplifier software, as well as a direct physical measurement of pulley belt(s), the entire robotics tool (or a portion thereof) is shipped to the robotics tool manufacturer for diagnostics, as access to customer manufacturing facilities to do the testing is typically prohibited. This incurs significant downtime and disruption to automated manufacturing such as semiconductor processing. The result of this downtime includes costs of production and/or costs of duplicative equipment that may be used while defective equipment is diagnosed and fixed.

SUMMARY

Some of the embodiments described herein cover a motion control server including a memory and a processor coupled to the memory. The processor may be adapted to (e.g., via execution of instructions) supply a torque command to an amplifier that controls a motor, wherein the motor drives a robot linkage. The processor may further include, in the torque command, an alternating signal wave that is to test a frequency response of the motor and the robot linkage. The processor may further receive, from the amplifier, an instantaneous torque value of the motor and an instantaneous mechanical parameter value of the robot linkage at each time step of a plurality of time steps according to a sampling rate and over a period of time. The processor may further store, in the memory, an aggregate of the instantaneous torque values and an aggregate of the instantaneous mechanical parameter values. The processor may further determine, for a first frequency of the alternating signal wave, a magnitude and phase shift between the aggregate of the instantaneous mechanical parameter values and the aggregate of the instantaneous torque values. The processor may further generate a bode plot fingerprint using an aggregate of magnitude and phase shift data for multiple frequencies of the alternating signal wave, the bode plot fingerprint to be used in performing diagnostics of the motor and the robot linkage.

In related embodiments, described herein is a method for diagnosing a servo controlled mechanism. The method may include supplying, by a motion controller, a torque command to a triple-loop amplifier that controls a motor, wherein the motor drives a robot linkage. The method may further include adding (including), by the motion controller to the torque command, an alternating signal wave that is to test a frequency response of the motor and the robot linkage. The method may further include receiving, from the triple-loop amplifier, by the motion controller, an instantaneous torque value of the motor and an instantaneous velocity value of the robot linkage at each time step of a plurality of time steps according to a sampling rate and over a period of time. The method may further include storing, by the motion controller in memory, an aggregate of the instantaneous torque values and an aggregate of the instantaneous velocity values. The method may further include determining, by the motion controller for a first frequency of the alternating signal wave, a magnitude and phase shift between the aggregate of the instantaneous velocity values and the aggregate of the instantaneous torque values. The method may further include generating, by the motion controller, a bode plot fingerprint using an aggregate of magnitude and phase shift data for multiple frequencies of the alternating signal wave, the bode plot fingerprint to be used in performing diagnostics of the motor and the robot linkage.

In a further embodiment for a non-transitory computer-readable storage medium that stores instructions, which when executed by a processing device of a motion controller, cause the processing device to perform a plurality of operations. The plurality of operations may include supplying a torque command to an amplifier that controls a motor, wherein the motor drives a robot linkage. The plurality of operations may further include adding (or including), to the torque command, an alternating signal wave that is to test a frequency response of the motor and the robot linkage. The plurality of operations may further include receiving, from the amplifier, an instantaneous torque value of the motor and an instantaneous position value of the robot linkage at each time step of a plurality of time steps according to a sampling rate and over a period of time. The plurality of operations may further include storing, in memory, an aggregate of the instantaneous torque values and an aggregate of the instantaneous position values. The plurality of operations may further include calculating, based on the instantaneous position values over the period of time, an aggregate of velocity values of the robot linkage. The plurality of operations may further include determining, for a first frequency of the alternating signal wave, a magnitude and phase shift between the aggregate of velocity values and the aggregate of the instantaneous torque values. The plurality of operations may further include generating, by the motion controller, a bode plot fingerprint using an aggregate of magnitude and phase shift data for multiple frequencies of the alternating signal wave, the bode plot fingerprint to be used in performing diagnostics of the motor and the robot linkage.

Numerous other features are provided in accordance with these and other embodiments of the disclosure. Other features and embodiments of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein are related to systems and methods for use in performing frequency response diagnostics for characterizing servo controlled mechanisms such as found in robotics tools that include a motor and robot linkage(s) driven by the motor. For example, a number of mechanical parameters of the robot linkage vary with frequency at which the motor is driven, including, for example, force, strain, compression, friction, resonance, position, velocity and the like. Further, frequency response diagnostics, also referred to as frequency response analysis (FRA), may successfully detect incorrect tensioning of pulley belts on a motor stack that impart force to components of the robot linkages, in addition to detecting the effects of natural resonances and bearing friction levels. Additionally, FRA may be used to diagnose incorrect inertia of the robot linkages or closed loop instability of the entire control system that includes the motor stack, pulley belts, and robot linkages.

Accordingly, to resolve the above-noted deficiencies in conventional methods for diagnosing defects or errors in servo controlled mechanisms, the present disclosure describes embodiments of executing instructions on a motion controller that performs the frequency response diagnostic data gathering and analysis, e.g., FRA. The motion controller may be a computing device (such as a motion control server) that performs motion control of the motor stack and robot linkages at a manufacturing facility on a daily basis. Accordingly, the motor stack and coupled robot linkages need not be disassembled or shipped to perform detailed frequency response diagnostics of a failed part, thus avoiding downtime of manufacturing processes.

In various embodiments, execution of the instructions cause the motion controller to insert an alternating signal wave (such as a sine wave or cosine wave) into a feedforward torque command sent to the amplifier that actuates a motor. The instructions also cause the motion controller to receive instantaneous values for torque of the motor and of the mechanical parameters of the robot linkage and store an aggregate of these instantaneous values for each frequency. The motion controller determines, for each frequency of the alternating signal wave, a magnitude and phase shift between the aggregate of the instantaneous mechanical parameter values and the aggregate of the instantaneous torque values. The motion controller then generates a fingerprint (such as a bode plot fingerprint) using an aggregate of magnitude and phase shift data for multiple frequencies of the alternating signal wave, e.g., by inserting a sine sweep or a cosine sweep. In one embodiment, the bode plot fingerprint is used in performing diagnostics of the motor and the robot linkage, e.g., by way of comparison with a baseline bode plot fingerprint taken of a properly functioning system when first deployed.

Also, in these embodiments, analytical comparison of these bode plot fingerprints may lead to detecting, among other defects or errors, incorrect inertia of a robot linkage, incorrect belt tension, or closed loop instability. Most robot linkages have four motors (e.g., more than one motor) that are closely cross-coupled and function in concert to drive the robot linkages with a number of pulley belts. Because the disclosed frequency response analysis is performed while the motor stack and robot linkage are still interconnected within the manufacturing facility, the diagnostics using FRA may collect a frequency response between motors in the a manufacturing configuration, thus being able to diagnose possible defects in the robot linkage and motor stack or if there is damage or incorrectly tensioned pulley belts. Additionally, cross-axis transfer functions may be calculated that provide additional performance information of the motor and linkages that was not previously available using conventional techniques. Further, days or weeks of downtime normally required due to disassembly and transportation of defective parts to perform failure analysis is avoided. Additional or different advantages will be apparent to those of ordinary skill in the art as explained with reference to the present figures.

Figure 1A:
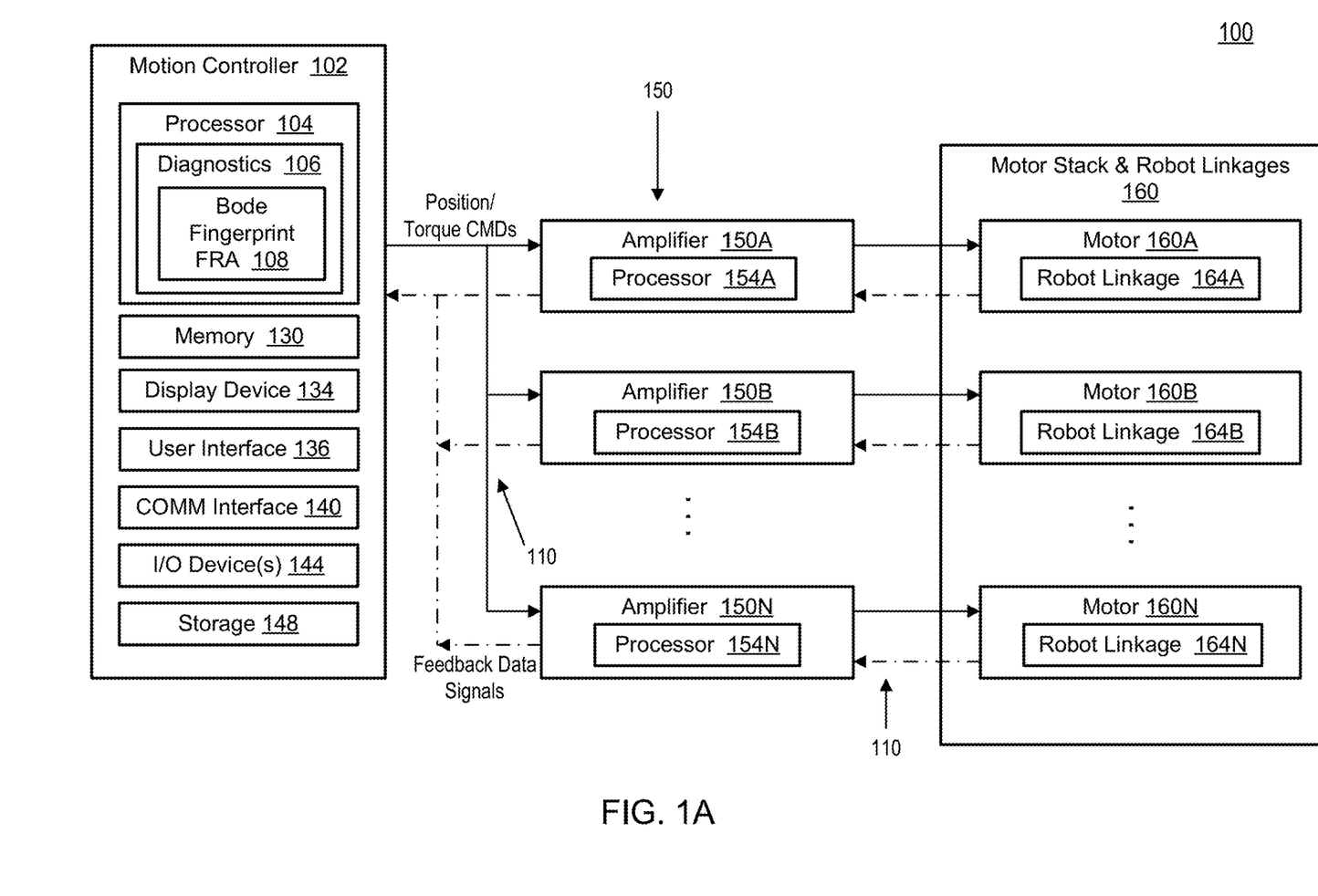
FIG. 1A is a block diagram of a control system that includes a motion controller coupled to multiple amplifiers that serve to actuate corresponding motors and robot linkages, according to various embodiments.

FIG. 1A is a block diagram of a control system 100 that includes a motion controller coupled to multiple amplifiers that serve to actuate corresponding motors and robot linkages, according to various embodiments. More specifically, the control system 100 may include a motion controller 102, a set of amplifiers 150, and a motor stack and robot linkages 160. The amplifiers 150 may be actuators to the motors as controlled by the motion controller 102. In various embodiments, the control system 100 is in relation to vacuum robots, atmospheric robots, robots with direct drive joints, and/or a hybrid array of direct drive (e.g., motor at the joint) and band driven robots. Atmospheric robots may have gear reducers with or without band or belt transmissions. Thus, reference to robot linkages should be viewed expansively and not with limits.

The motor stack and robot linkages 160 may include multiple motors and robot linkages, e.g., a first motor 160A and a first robot linkage 164A, a second motor 160B and a second robot linkage 164B, and an Nth motor 160N and an Nth robot linkage 164N. In one embodiment, the robot linkages 164A, 164B . . . 16N are interconnected, and thus the multiple motors 160A, 160B . . . 160N may work in cooperation to move the robot linkages as directed by the motion controller 102 and according to feedback from the motors and robot linkages. There may not be a robot linkage per motor, therefore, where some of the motors may jointly couple to and move one or a combination of robot linkages. In another embodiment, one or more of the motors 160A, 160B . . . 160N independent control at least some of the respective robot linkages.

The amplifiers 150 may include a first amplifier 150A, a second amplifier 150B, and a Nth amplifier 150N, each including a respective processor 154A, 154B . . . 154N to execute commands (e.g., instructions) received from the motion controller 102. The control system 100 may include an amplifier for each motor, so that independent control of each motor is possible despite the fact that the motors may operate in cooperation in some embodiments. Each amplifier 150A, 150B . . . 150N may include firmware or other software code stored in a local memory sufficient to execute the command (or instructions) received from the motion controller 102. The amplifiers 150A, 150B . . . 150N may each be a proportional-integral-derivative (PID) controller, a PI controller, or a triple-loop controller, which will be discussed in more detail with reference to FIG. 1B.

The control system 100 may further include a communication network 110 that is responsive and determinative enough to enable real-time feedback control between the motion controller 102, the amplifiers 150, and the motor stack and robot linkages 160. For example, the communication network 110 may include data update times of less than 100 microseconds and communication jitter of less than one microsecond. Accordingly, the communication network 110 may be consistent with or similar to Ethernet for Control Automation Technology (EtherCAT).

The communication network 110 may further employ Controller Area Network open (CANopen) protocol or a similar master-slave communication model. Distributed motion networks in accordance with one or more embodiments may permit distributed motion planning while providing close coordination with instructions from the motion controller 102 (master). Software programs/firmware may be stored respectively in the motion controller 102 (master) and in the actuator drivers, here referred to as the amplifiers 150 (slaves). This may allow motion planning to be distributed among the master and slave(s) and reduces the burden on the master and the communication network 110 by reducing the amount of data transfer that may occur over the communication network.

For example, a motion instruction with respect to gap calibration generated by the motion controller 102 (master) may initiate movement of the motor 160A between a first position (e.g., a safe starting position) and a second position (e.g., a target position beyond the expected contact position) within predefined constraints of velocity and acceleration. The motion instruction may be received by a motion planner internal to an actuator driver (slave) which, based on the motion instruction data, generates a motion profile precisely describing the motion of the first motor 160A on an instant by instant basis to control speed and acceleration changes, e.g., to limit "jerk," the first derivative of acceleration, the latter which may produce undesired wear or oscillations on the motor and attached components.

Accordingly, the commanded motion data need not be transmitted over the communication network 110, but only the higher-level motion command that initiates the motion planner in the actuator drivers. The distributed nature of motion planning frees up communication network traffic for transmitting real-time process data including motion feedback data (which may be between one sample per millisecond, one sample per 20 milliseconds, or some other sampling rate) from the amplifier 150A, the motor 160A, and/or robot linkage 164A to the motion controller 102 without reducing motion positioning performance. This distributed control also allows the motion controller 102 (master) to control multiple motors concurrently for gap calibration or other functions. The disclosed methods herein may therefore be performed in a motion control system having motion-planning capable actuator drivers in accordance with one or more embodiments.

In some embodiments, the motion controller 102 sends position commands and torque commands (e.g., feedforward torque commands) to the multiple amplifiers 150 to control the motors, and thus, the robot linkages. These commands will be discussed in more detail with reference to FIG. 1B. In order to gather frequency analysis data, the motion controller 102 may further receive feedback data signals from the amplifiers 150 at each time step of multiple time steps according to a sampling rate and over a period of time. For example, the diagnostic test may be run for a number of seconds at each of multiple frequencies, in order to generate the feedback data that will be used to generate the bode plot fingerprints as will be discussed in more detail. Each feedback data signal may include instantaneous torque values (of the motors) and instantaneous hardware parameter values (from the linkages and pulley belts). These feedback data signals are illustrated as dashed lines in FIG. 1A. The hardware parameter values may vary depending on application, including but not limited to, force, strain, compression, friction, resonance, position, or velocity of at least one of the linkage(s).

In various embodiments, the motion controller 102 includes, but is not limited to, a processor 104 that includes hardware or executes instructions, including firmware, to perform diagnostics 106, including bode fingerprint frequency response analysis (FRA) 108 meant to diagnosis defects or errors within the motor stack and robot linkages 160. The motion controller 102 may further include a memory 130 (volatile, non-volatile, or a combination thereof), e.g., in which to store instructions that are being executed by the processor 104. The memory 130 may further buffer an aggregate of the instantaneous torque values and the instantaneous hardware parameter values received by way of the feedback data signals from the motor stack and robot linkages 160. The motion controller 102 may further include a display device 134, such as a monitor, display screen, or the like, a user interface 136 that facilitates interaction between an operator within the display device 134, a communication interface 140, multiple input/output (I/O) device 144, and a storage device 148 (e.g., one or more disk drives and/or solid state drives).

In embodiments, the communication interface 140 facilitates communication over the communication network 110 with the amplifiers 150A, which was discussed. The I/O devices 144 may include input devices such as a keyboard, mouse, touchpad, microphone, and the like, as well as output devices such as a speaker, the display device 134, a printer, or the like. The storage device 148 may store software, e.g., a non-transitory computer-readable storage medium that stores instructions, and act as permanent storage for the aggregate of instantaneous torque values and instantaneous hardware parameter values on which FRA is performed. The motion controller 102 may execute the instructions to perform one or more of the methodologies and/or embodiments described herein. When memory is referred to herein, it is to be understood to mean either or both of the memory 130 (e.g., main memory) or the storage device (e.g., non-volatile, long-term computer storage).

In one embodiment, the storage device 148 stores a data structure 131 (such as a table or database, see FIG. 1B) that aggregates magnitude and phase shift values between a set of aggregated instantaneous torque values (from one or more motors) and a corresponding set of aggregated instantaneous hardware parameter values (from a robot linkage coupled to the one or more motors). These values may be sequentially aggregated as the alternating signal wave is swept through multiple frequencies and inserted on top of the torque commands sent to the respective amplifiers 150. As the magnitude and phase shift data collected over a range of frequencies, it forms a transfer function of the control system 100, which may then be used to design or update the gain and filters used to control the robot linkages.

Figure 1B:
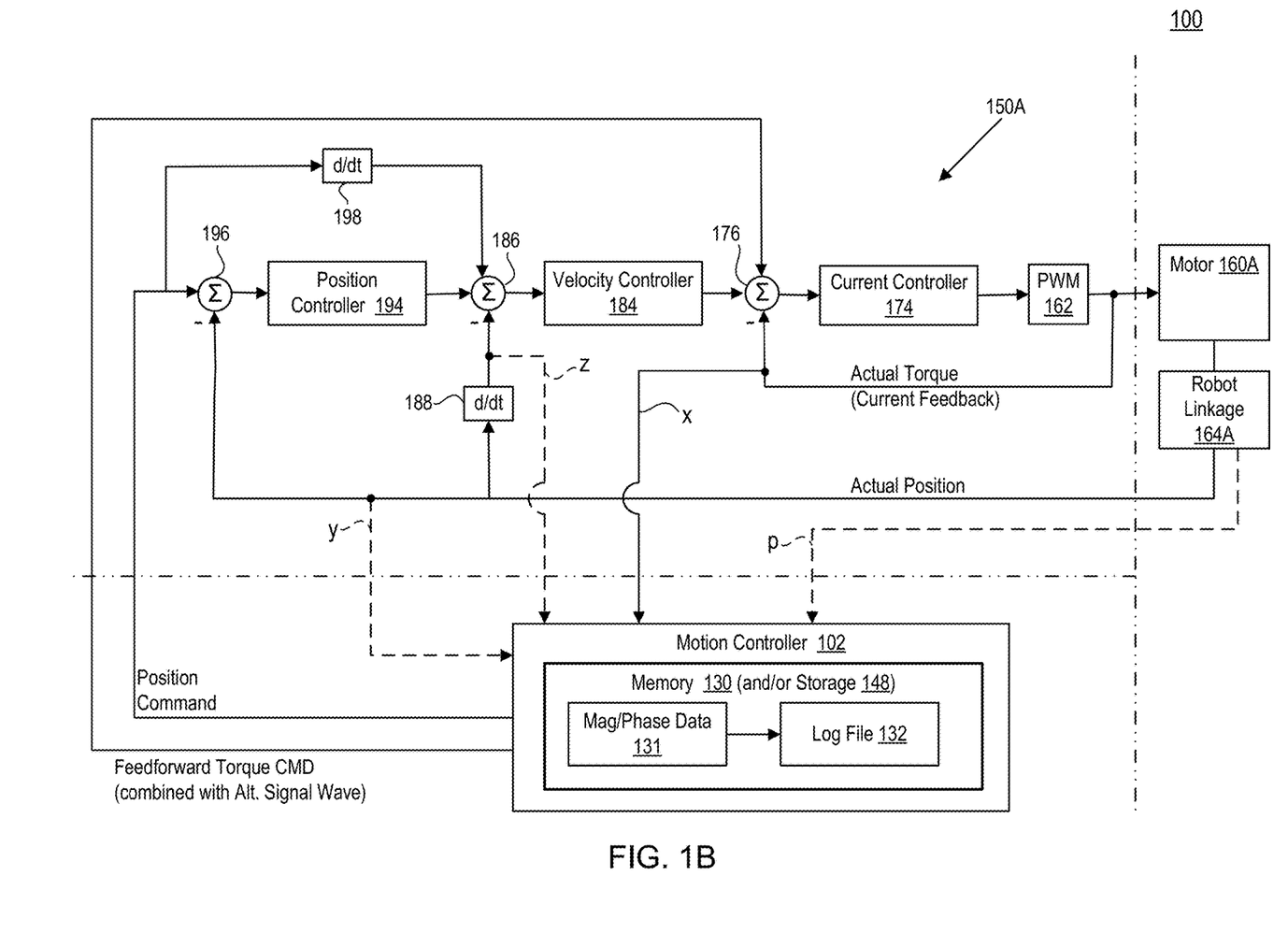
FIG. 1B is a more detailed block diagram of the control system of FIG. 1A, illustrating an example triple-loop amplifier that actuates a motor and robot linkage according to an embodiment.

In various embodiments, the data structure 131 may also be stored in the memory 130 and kept coherent with the data structure 131 stored in storage device 148. After testing has been completed through multiple frequencies, and the data structure 131 is complete for a given test, the motion controller 102 may save the data structure 131 to a log file 132 (FIG. 1B). The motion controller 102 may then use the data stored in the log file to generate a bode plot fingerprint using an aggregate of magnitude and phase shift data for the multiple frequencies of the alternating signal wave, e.g., which was inserted as a sine sweep or a cosine sweep. Each bode plot fingerprint may also be stored in a log file 132 that may be permanently stored in the storage device 148 and optionally displayed in the display device 134 to an operator.

The bode plot fingerprint may be used in performing diagnostics of the motor and the robot linkage, e.g., by way of comparison with a baseline bode plot fingerprint taken of a properly functioning system when the control system 100 was first deployed. For example, the processor 104 may compare the bode plot fingerprint with a baseline bode plot fingerprint previously generated for the motor and the linkage. The processor 104 may also determine, based on the comparison, that one of the motor or the linkage has a defect or error. In response to detecting a defect or error, the motion controller 102 may notify an operator of the defect or error via the user interface or other I/O device 144, including the display device 134 or the like.

The motion controller 102 may be and/or include a computing device such as a personal computer, a server computer (e.g., a motion control server), a programmable logic controller (PLC), a microcontroller, and so on. The motion controller 102 may include one or more processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like.

FIG. 1B is a more detailed block diagram of the control system 100 of FIG. 1A, illustrating an example triple-loop amplifier that actuates a motor and robot linkage according to an embodiment. More specifically, the amplifier 150A of the control system 100 may be a triple-loop amplifier that controls actuation of the first motor 160A and the first robot linkage 164A. Unlike simpler control applications, servo motor designs depend on three interdependent performance characteristics: position, velocity, and current. To change position of the motor rotor, its velocity needs to change. In turn, to change its velocity, the current applied to the motor windings through pulse-width modulation (PWM) needs to change.

Servo motor control developers reflect this loop interdependence in a cascade control structure as illustrated in FIG. 1B. More specifically, a set of three controllers may be arranged in series, from closest to the motor to farthest way, including a current controller 174, a velocity controller 184, and a position controller 164. Each controller receives a control feedback value, including a current (e.g., indicative of actual torque), a velocity of the robot linkage 164A, and a position of the robot linkage 164A, respectively. The velocity feedback value may also be tapped directed from the motor 160A, but is illustrated as the derivative over time of the position value for simplicity. In being at the inner loop position, the current controller 174 feeds a pulse-width modulation (PWM) amplifier 162, which supplies current to the motor 160A at the frequency directed by the current controller 174.

This nested approach inherently aids stability by correcting underlying errors before they can propagate. For example, the innermost current loop can independently modify torque to respond to a change in load (at the robot linkages) well before the load change significantly impacts velocity and position. At the same time, this nested approach means that outer loops (velocity and position) can only perform as well as their underlying inner loops. In servo systems, efforts to enhance position and speed performance will inevitably fall short if the inner loop lacks the bandwidth to support outer loop performance expectations. Ultimately, the performance of the inner current loop effectively defines the limits of performance of the overall servo system. This is one reason for employing the communication network 110 as an EtherCAT-based network.

In various embodiments, with more specificity to this triple-control structure, the amplifier 150A may include a first summer 176 that combines a feedforward torque command (or just torque command for simplicity) from the motion controller 102, an output from the velocity controller, and a feedback current value (actual torque) from an output of the PWM amplifier 162. An output of the first summer 176 may be a control signal input into the current controller 174.

Further, the amplifier 150A may include a second summer 186 that combines a velocity command (converted by a derivative calculator 198 of the position command received from the motion controller 102), an output of the position controller 194, and a feedback velocity value from the motor or robot linkage. The output of the second summer 186 may be a control signal input into the velocity controller 184. Additionally, the amplifier 150A may include a third summer 196 that combines a position command (received from the motion controller 102) and a position feedback value from the robot linkage 164A. The output of the third summer 196 may be a control input signal into the position controller 194.

In various embodiments, the triple loop control structure of the amplifier 150A facilitates sending, to the motion controller 102, feedback data signals that include instantaneous values of the torque and other hardware parameters associated with the robot linkage 164A, the pulley belt, and friction from bearings, for example. Feedback of the instantaneous torque is labeled with solid line (x). Other feedback data signals are illustrated with dashed lines meaning they are optional, as the motion controller 102 may use any other instantaneous value in comparison with the instantaneous torque to determine magnitude and phase shift for frequency response analysis, where the magnitude and phase shift may be scaled for proper comparison later with a baseline bode plot fingerprint.

More specifically, feedback of the instantaneous hardware parameter values is illustrated with a dashed line (p), of the instantaneous position value is illustrated with a dashed line (y), and the instantaneous velocity value is illustrated with a dash line (z). While the instantaneous position and velocity values are hardware parameter values, these y and z values are normally available passing as feedback values within the amplifier 150A. The instantaneous velocity value may also be obtained from inputting an instantaneous position value into a derivative calculator 188. In some embodiments, the processor 154A (FIG. 1A) of the amplifier 150A receives and facilitates transmission of these instantaneous values from the amplifier 150A to the motion controller 102, but is not illustrated in FIG. 1B for simplicity of illustration. The processor 154A may also receive and transmit, to respective summers 176 and 196, values associated with or translated from the feedforward torque command and the position command, respectively. This optional additional step is also not illustrated to keep FIG. 1B simple and less cluttered.

In an embodiment, the motion controller 102 may aggregate these instantaneous values into the data structure 131 of the memory 130 (and/or storage device 148) so that the motion controller 102 may collect them over time on which to perform FRA that generates the magnitude and phase shift data for a given frequency. The motion controller 102 may combine the aggregate of the amplitude and phase shift data for multiple frequencies into the data structure 131, which once is full from a complete test, may be stored in the log file 132, as was discussed.

Figure 2A:
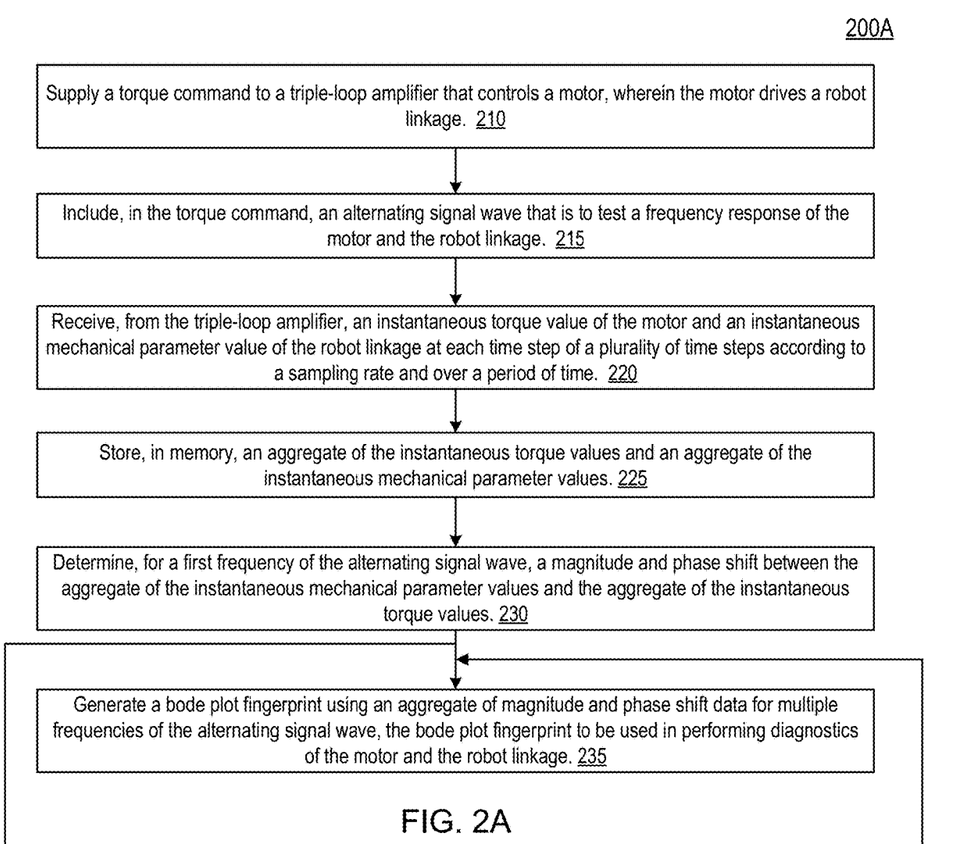
FIG. 2A is a flow chart of a method for performing frequency response diagnostics for characterizing servo controlled mechanisms, according to various embodiments.
Figure 2B:
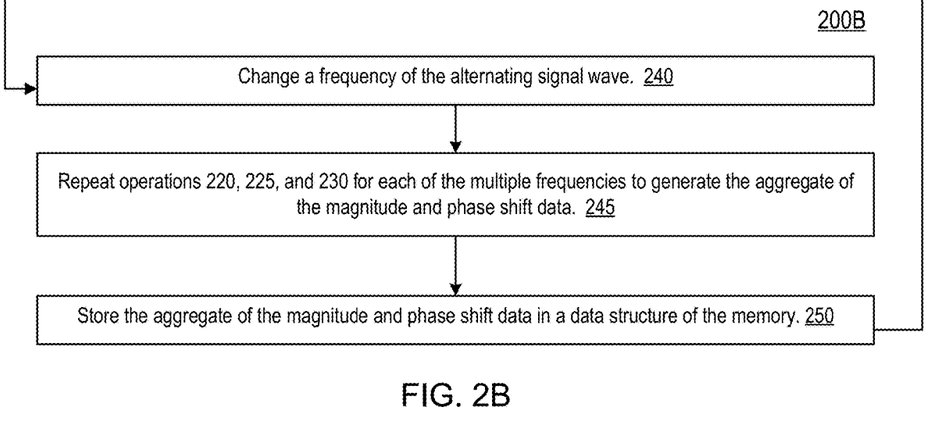
FIG. 2B is a flow chart of a method for generation of an aggregate of magnitude and phase shift data usable for the frequency response diagnostics, according to an embodiment.

FIG. 2A is a flow chart of a method 200A for performing frequency response diagnostics for characterizing servo controlled mechanisms, according to various embodiments. FIG. 2B is a flow chart of a method 200B for generation of an aggregate of magnitude and phase shift data usable for the frequency response diagnostics, according to an embodiment. The methods 200A and 200B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the methods 200A and 200B are performed by the motion controller 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic supplies a torque command to an amplifier that controls a motor, wherein the motor drives a robot linkage. The torque command be a feedback forward torque command to the first summer 176, for example, as discussed with reference to FIG. 1B. At operation 215, the processing logic includes (or adds), in the torque command, an alternating signal wave that is to test a frequency response of the motor and the robot linkage. This alternating signal wave may be a sine sweep, a cosine sweep, or another sweep of an alternating signal wave that changes in frequency every so often, e.g., after a period of time. This period of time may be set to a second, to several seconds, or longer, depending on length of the test.

At operation, 220, the processing logic receives, from the amplifier, an instantaneous torque value of the motor and an instantaneous mechanical parameter value of the robot linkage at each time step of multiple time steps according to a sampling rate and over the period of time. The instantaneous mechanical parameter value may indicate one of force, strain, compression, friction, resonance, position, or velocity of at least one component of the robot linkage, for example. At operation 225, the processing logic stores, in memory, an aggregate of the instantaneous torque values and an aggregate of the instantaneous mechanical parameter values. These aggregated values may be stored, for example, in the data structure 131 (FIG. 1B).

At operation 230, the processing logic determines, for a first frequency of the alternating signal wave, a magnitude and phase shift between the aggregate of the instantaneous mechanical parameter values and the aggregate of the instantaneous torque values. At operation 235, the processing logic generates a bode plot fingerprint using an aggregate of magnitude and phase shift data for multiple frequencies of the alternating signal wave, the bode plot fingerprint to be used in performing diagnostics of the motor and the robot linkage With reference to FIG. 2B, at operation 240, the processing logic may change a frequency of the alternating signal wave. At operation 245, the processing logic may determine, for each of the multiple frequencies of the alternating signal wave, the magnitude and phase shift between the aggregate of the instantaneous mechanical parameter values and the aggregate of the instantaneous torque values. For example, the processing logic may repeat operations 220, 225, and 230 for each of the multiple frequencies to generate the aggregate of magnitude and phase shift data used at operation 235. At operation 250, the processing logic may store the aggregate of the magnitude and phase shift data, obtained for the multiple frequencies, in a data structure of the memory, e.g., the data structure 131. The processing logic may thus, at operation 235, use this aggregate of instantaneous values stored in the data structure to generate the bode plot fingerprint.

Figure 2C:
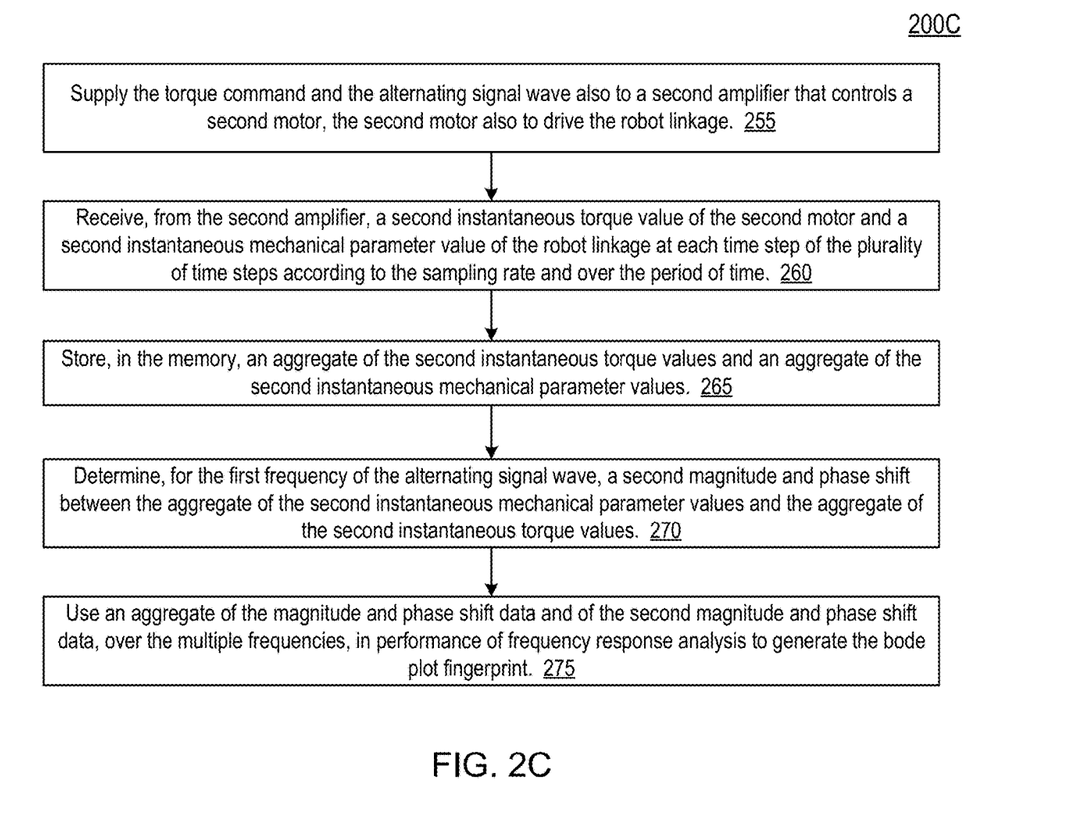
FIG. 2C is a flow chart of a method for generation of an aggregate of magnitude and phase shift data from two motors and a root linkage usable for the frequency response diagnostics, according to an embodiment.

Because the processing logic may also test multiple motors of the motor stack and robot linkages 160 that are coupled to the same robot linkage, the method 200A and 200B may be expanded to include gathering additional magnitude and phase data from a second amplifier coupled to a second motor. FIG. 2C is a flow chart of a method 200C for generation of an aggregate of magnitude and phase shift data from two motors and a root linkage usable for the frequency response diagnostics, according to an embodiment. The method 200C may also be performed by similar processing logic as the methods 200A and 200B, e.g., the motion controller.

With reference to FIG. 2C, at operation 255, the processing logic supplies the torque command and the alternating signal wave also to a second amplifier that controls a second motor, the second motor also to drive the robot linkage. This second motor, for example, may be aligned along a second axis of the robot linkage where the first motor (of methods 200A and 200B) are aligned along a first axis thereof. At operation 260, the processing logic receives, from the second amplifier, a second instantaneous torque value of the second motor and a second instantaneous mechanical parameter value of the robot linkage at each time step of the multiple time steps according to the sampling rate and over the period of time.

At operation 265, the processing logic stores, in the memory, an aggregate of the second instantaneous torque values and an aggregate of the second instantaneous mechanical parameter values. At operation 270, the processing logic determines, for the first frequency of the alternating signal wave, a second magnitude and phase shift between the aggregate of the second instantaneous mechanical parameter values and the aggregate of the second instantaneous torque values. At operation 275, the processing logic uses an aggregate of the magnitude and phase shift data (from the methods 200A and 200B) and the second magnitude and phase shift data, over the multiple frequencies, in performance of frequency response analysis to generate the bode plot fingerprint. In this way, the bode plot fingerprint includes frequency response information from both the first motor and the second motor that are both driving the same robot linkage. This technique may be extended to additional (e.g., third and fourth) motors that are also used to control the same robot linkage.

Figure 3:
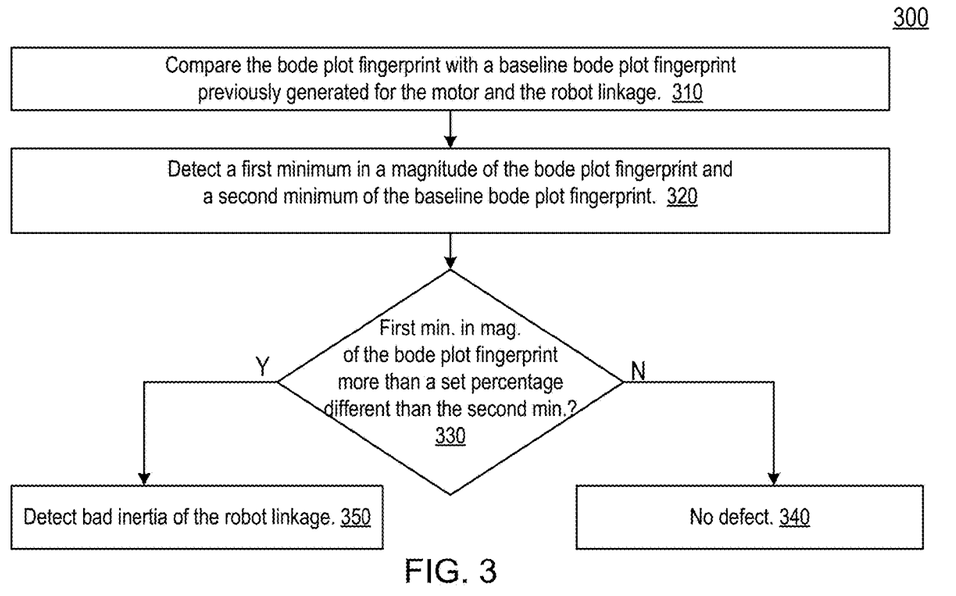
FIG. 3 is a flow chart of a method of bode plot fingerprint comparison to detect bad inertia of the robot linkage, according to an embodiment.
Figure 4:
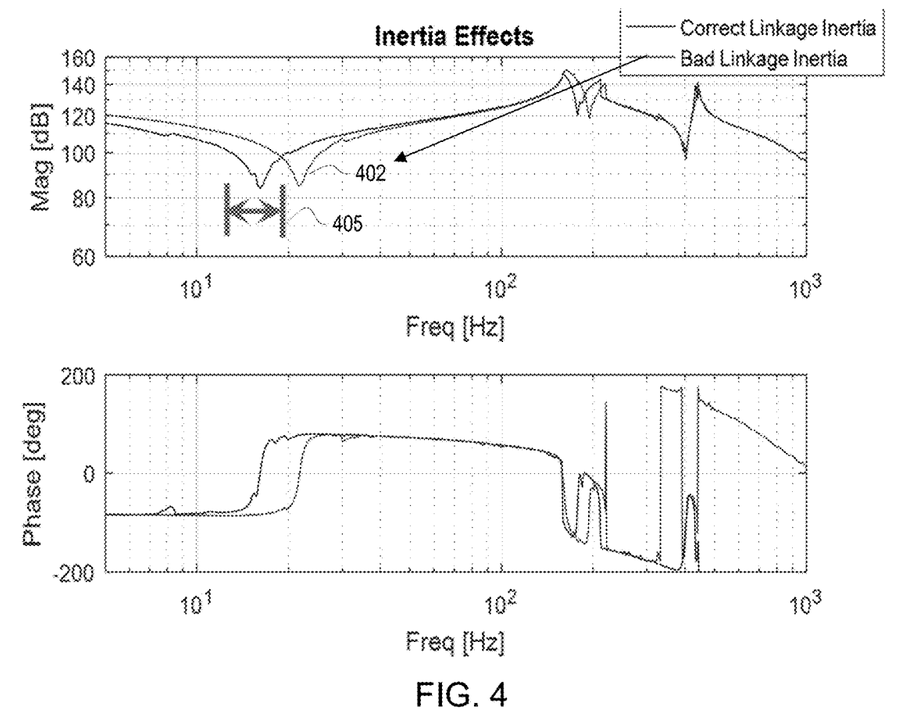
FIG. 4 is a pair of graphs of the magnitude and phase shift bode plot fingerprints that illustrate bad inertia of the robot linkage, according to an embodiment.

FIG. 3 is a flow chart of a method 300 of bode plot fingerprint comparison to detect bad inertia of the robot linkage, according to an embodiment. FIG. 4 is a pair of graphs of the magnitude and phase shift bode plot fingerprints that illustrate bad inertia of the robot linkage, according to an embodiment. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the motion controller 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 3, at operation 310, the processing logic compares the bode plot fingerprint (e.g., generated at method 200A or 200C) with a baseline bode fingerprint previously generated for the motor(s) and robot linkage. This comparison may be made by comparing both plots at corresponding frequencies in order to detect differences and/or similarities between the two. The comparison may also be performed on the raw magnitude and phase data stored in the data structure 131 that may optionally be located in the log file 132.

At operation 320, the processing logic detects a first minimum in a magnitude of the bode plot fingerprint and a second minimum of the baseline bode plot fingerprint. This first magnitude 402 is illustrated in the right-most bode plot fingerprint of FIG. 4 that illustrates magnitude.

At operation 330, the processing logic determines whether the first minimum is more than a set percentage different than the second minimum. This percentage may be set during manufacturing or set by a customer, but may be approximately 5 percent, 10 percent, 20 percent, or some similar percentage, above which a defect will be detected. FIG. 4 illustrates a frequency span 405 around the second minimum of the baseline bode plot fingerprint that is the safe zone in one embodiment. Because the first minimum is outside of this frequency span 405, the processing logic would consider the bode plot fingerprint of FIG. 4 to indicate a defect or error.

If the first minimum is not more than the set percentage different than the second minimum, at operation 340, the processing logic detects no defect or error. If the first minimum is more than the set percentage different than the second minimum, at operation 350, the processing logic detects bad inertia of the robot linkage, which can be reported to the operator.

Figure 5:
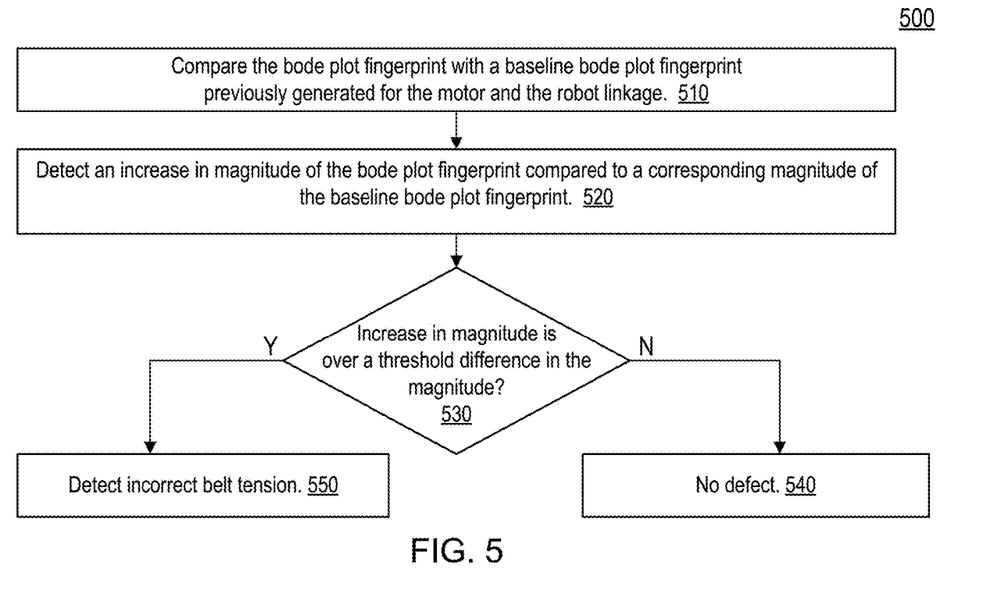
FIG. 5 is a flow chart of a method of bode plot fingerprint comparison to detect incorrect belt tension, according to an embodiment.
Figure 6:
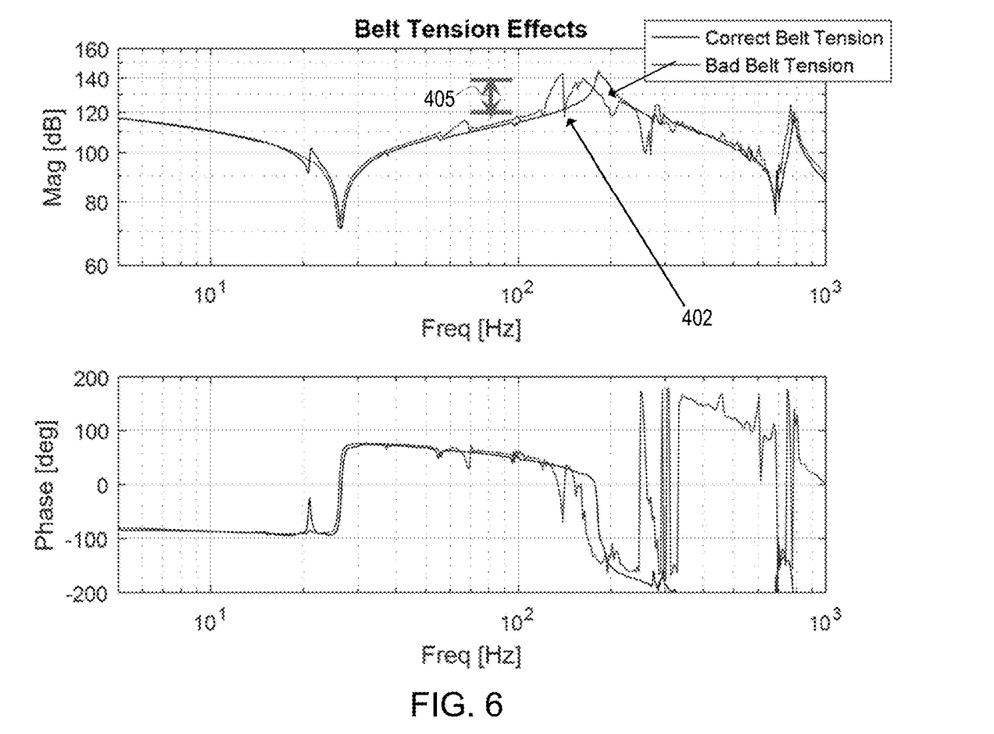
FIG. 6 is a pair of graphs of the magnitude and phase shift bode plot fingerprints that illustrate incorrect belt tension, according to an embodiment.

FIG. 5 is a flow chart of a method 500 of bode plot fingerprint comparison to detect incorrect belt tension, according to an embodiment. FIG. 6 is a pair of graphs of the magnitude and phase shift bode plot fingerprints that illustrate incorrect belt tension, according to an embodiment. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the motion controller 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 5, at operation 510, the processing logic compares the bode plot fingerprint (e.g., generated at method 200A or 200C) with a baseline bode fingerprint previously generated for the motor(s) and robot linkage. This comparison may be made by comparing both plots at corresponding frequencies in order to detect differences and/or similarities between the two. The comparison may also be performed on the raw magnitude and phase data stored in the data structure 131 that may optionally be located in the log file 132.

At operation 520, the processing logic detects an increase in magnitude of the bode plot fingerprint compared to a corresponding magnitude of the baseline bode plot fingerprint. The magnitude plot of the bode plot fingerprint of FIG. 6 illustrates such an increase in magnitude at 402. At operation 530, the processing logic determines whether the increase in magnitude between the two bode plot fingerprints is over a threshold difference in the magnitude. In one embodiment, this difference may be an increase in magnitude of over 20 decibels (dB) from the baseline bode fingerprint magnitude, which is illustrated at 405 in FIG. 6. Additional threshold differences may be chosen and programmed into the processing logic, such as 5 dB, 10 dB, 15 dB, 25 dB, or the like.

If the increase in magnitude is within the threshold difference in magnitude, at operation 540, the processing logic detects no defect or error. If the increase in magnitude is over (or beyond) the threshold difference in magnitude, at operation 550, the processing logic detect an incorrect belt tension that may then be reported to the operator.

Figure 7:
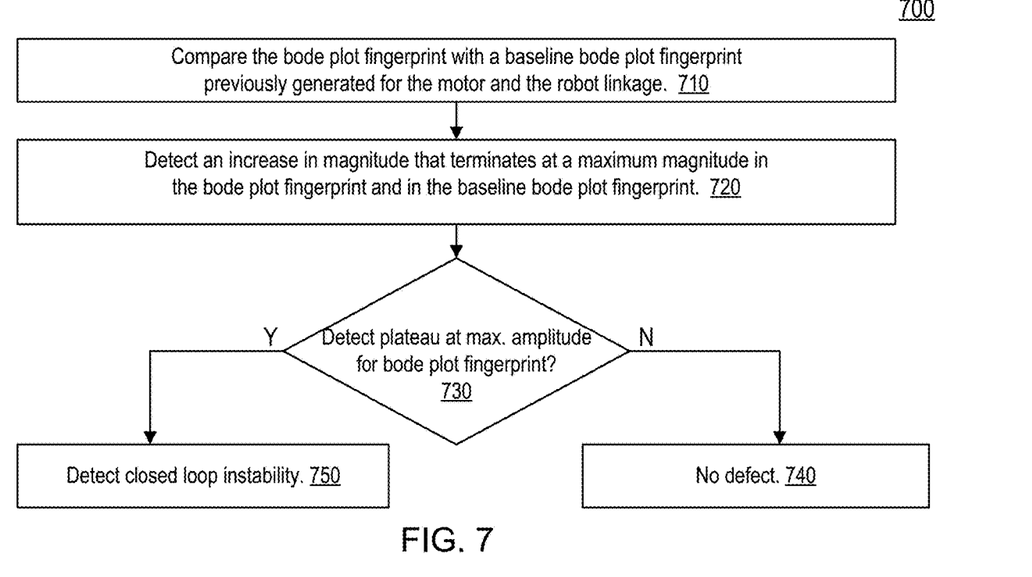
FIG. 7 is a flow chart of a method of bode plot fingerprint comparison to detect closed loop instability, according to an embodiment.
Figure 8:
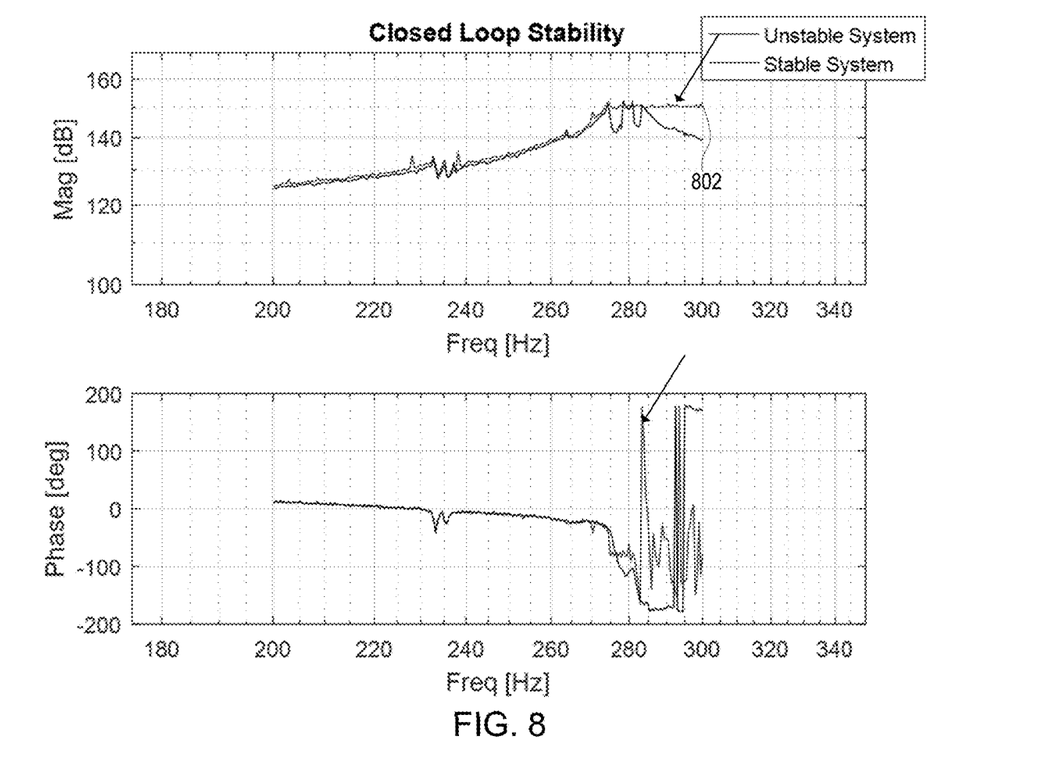
FIG. 8 is a pair of graphs of the magnitude and phase shift bode plot fingerprints that illustrate closed loop instability, according to an embodiment.

FIG. 7 is a flow chart of a method 700 of bode plot fingerprint comparison to detect closed loop instability, according to an embodiment. FIG. 8 is a pair of graphs of the magnitude and phase shift bode plot fingerprints that illustrate closed loop instability, according to an embodiment. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the motion controller 102 (FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 7, at operation 710, the processing logic compares the bode plot fingerprint (e.g., generated at method 200A or 200C) with a baseline bode fingerprint previously generated for the motor(s) and robot linkage. This comparison may be made by comparing both plots at corresponding frequencies in order to detect differences and/or similarities between the two. The comparison may also be performed on the raw magnitude and phase data stored in the data structure 131 that may optionally be located in the log file 132.

At operation 710, the processing logic detect an increase in magnitude that terminates at a maximum magnitude in the bode plot fingerprint and in the baseline bode plot fingerprint. FIG. 8 illustrates how both curves peak at about 150 dB. At operation 720, the processing logic determines whether a plateau 802 is detected at the maximum amplitude for the bode plot fingerprint. This plateau may be detected, for example, by calculating an average slope of approximately zero after the maximum amplitude is detected.

If a plateau at the maximum amplitude is not detected, at operation 740, the processing logic detects no defect or error. If the processing logic detects a plateau at the maximum amplitude for the bode plot fingerprint, at operation 750, the processing logic detects closed loop instability for the control system 100, starting at the frequency where the plateau 802 begins, which can be reported to an operator. In this example, the instability of the control system 100 begins at a frequency of approximately 275 Hz. Additional defects or errors may be similarly detected and reported to a system operator.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A motion control server comprising:
a memory; and
a processor coupled to the memory, the processor to:
supply a torque command to an amplifier that controls a motor, wherein the motor drives a robot linkage;
include, in the torque command, an alternating signal wave that is to test a frequency response of the motor and the robot linkage;
receive, from the amplifier, an instantaneous torque value of the motor and an instantaneous mechanical parameter value of the robot linkage at each time step of a plurality of time steps according to a sampling rate and over a period of time;
store, in the memory, an aggregate of the instantaneous torque values and an aggregate of the instantaneous mechanical parameter values;
determine, for a first frequency of the alternating signal wave, a magnitude and phase shift between the aggregate of the instantaneous mechanical parameter values and the aggregate of the instantaneous torque values;
generate a fingerprint using an aggregate of magnitude and phase shift data for multiple frequencies of the alternating signal wave; and
perform frequency response diagnostics, using the fingerprint, of the motor and the robot linkage.

2. The motion control server of claim 1, wherein the memory further stores instructions, which when executed by the processor, cause the motion control server to communicate as a master over a communication network with the amplifier as a slave, wherein the communication network comprises data update times of less than 100 microseconds and communication jitter of less than one microsecond.

3. The motion control server of claim 1, wherein the instantaneous mechanical parameter value comprises one of force, strain, compression, friction, resonance, position, or velocity of at least one component of the robot linkage.

4. The motion control server of claim 1, wherein the processor is to supply the torque command combined with the alternating signal wave to a current controller of the amplifier, the processor further to:
change a frequency of the alternating signal wave;
determine, for each of the multiple frequencies of the alternating signal wave, the magnitude and phase shift between the aggregate of the instantaneous mechanical parameter values and the aggregate of the instantaneous torque values; and
store the aggregate of the magnitude and phase shift data, obtained for the multiple frequencies, in a data structure of the memory.

5. The motion control server of claim 1, wherein the fingerprint is a bode plot fingerprint, and wherein the processor is further to:
compare the bode plot fingerprint with a baseline bode plot fingerprint previously generated for the motor and the robot linkage; and
determine, based on the comparison, that one of the motor, the robot linkage, or a belt that couples the motor to the robot linkage, has a defect.

6. The motion control server of claim 5, wherein the processor is further to:
detect a first minimum in a magnitude of the bode plot fingerprint and a second minimum of the baseline bode plot fingerprint; and
detect, based on the first minimum being more than a set percentage different than the second minimum, a bad inertia of the robot linkage.

7. The motion control server of claim 5, wherein the processor is further to:
detect an increase in magnitude of the bode plot fingerprint compared to a corresponding magnitude of the baseline bode plot fingerprint; and
detect an incorrect tension of the belt based on determining that the increase in magnitude is over a threshold difference in the magnitude.

8. The motion control server of claim 5, wherein processor is further to:
detect an increase in magnitude that terminates at a maximum magnitude in the bode plot fingerprint and in the baseline bode plot fingerprint;
detect a plateau in amplitude at the maximum magnitude for the bode plot fingerprint; and
determine the defect is closed loop instability in response to detecting the plateau.

9. The motion control server of claim 1, wherein the fingerprint is a bode plot fingerprint, and wherein the processor is further to:
supply the torque command and the alternating signal wave also to a second amplifier that controls a second motor, the second motor also to drive the robot linkage;
receive, from the second amplifier, a second instantaneous torque value of the second motor and a second instantaneous mechanical parameter value of the robot linkage at each time step of the plurality of time steps according to the sampling rate and over the period of time;
store, in the memory, an aggregate of the second instantaneous torque values and an aggregate of the second instantaneous mechanical parameter values;
determine, for the first frequency of the alternating signal wave, a second magnitude and phase shift between the aggregate of the second instantaneous mechanical parameter values and the aggregate of the second instantaneous torque values; and
wherein, to generate the bode plot fingerprint, the processor is further to use an aggregate of the magnitude and phase shift data and of the second magnitude and phase shift data, over the multiple frequencies, in performance of frequency response analysis.

10. A method comprising:
supplying, by a motion controller, a torque command to a triple-loop amplifier that controls a motor, wherein the motor drives a robot linkage;
including, by the motion controller in the torque command, an alternating signal wave that is to test a frequency response of the motor and the robot linkage;
receiving, from the triple-loop amplifier, by the motion controller, an instantaneous torque value of the motor and an instantaneous velocity value of the robot linkage at each time step of a plurality of time steps according to a sampling rate and over a period of time;
storing, by the motion controller in memory, an aggregate of the instantaneous torque values and an aggregate of the instantaneous velocity values;
determining, by the motion controller for a first frequency of the alternating signal wave, a magnitude and phase shift between the aggregate of the instantaneous velocity values and the aggregate of the instantaneous torque values;
generating, by the motion controller, a fingerprint using an aggregate of magnitude and phase shift data for multiple frequencies of the alternating signal wave; and
performing, using the fingerprint, frequency response diagnostics of the motor and the robot linkage.

11. The method of claim 10, wherein the supplying and the including comprises supplying the torque command and the alternating signal wave to a current controller of the triple-loop amplifier, the method further comprising:
changing a frequency of the alternating signal wave;
repeating the receiving, the storing, and the determining for each of the multiple frequencies to generate the aggregate of the magnitude and phase shift data; and
storing the aggregate of the magnitude and phase shift data in a data structure of the memory.

12. The method of claim 10, wherein the fingerprint is a bode plot fingerprint, the method further comprising:
comparing, by the motion controller, the bode plot fingerprint with a baseline bode plot fingerprint previously generated for the motor and the robot linkage; and
determining, based on the comparing, that one of the motor, the robot linkage, or a belt that couples the motor to the robot linkage, has a defect.

13. The method of claim 12, wherein the determining comprises:
detecting a first minimum in a magnitude of the bode plot fingerprint and a second minimum of the baseline bode plot fingerprint; and
detecting, based on the first minimum being more than a set percentage different than the second minimum, a bad inertia of the robot linkage.

14. The method of claim 12, wherein the determining comprises:
- detecting an increase in magnitude of the bode plot fingerprint compared to a corresponding magnitude of the baseline bode plot fingerprint; and
- detecting an incorrect tension of the belt based on determining that the increase in magnitude is over a threshold difference in the magnitude.

15. The method of claim 12, wherein the determining comprises:
- detecting an increase in magnitude that terminates at a maximum magnitude in the bode plot fingerprint and in the baseline bode plot fingerprint;
- detecting a plateau in amplitude at the maximum magnitude for the bode plot fingerprint; and
- determining the defect is closed loop instability in response to detecting the plateau.

16. The method of claim 10, wherein the fingerprint is a bode plot fingerprint, the method further comprising;
- supplying the torque command and the alternating signal wave also to a second amplifier that controls a second motor, the second motor also to drive the robot linkage;
- receiving, from the second amplifier, a second instantaneous torque value of the second motor and a second instantaneous mechanical parameter value of the robot linkage at each time step of the plurality of time steps according to the sampling rate and over the period of time;
- storing, in the memory, an aggregate of the second instantaneous torque values and an aggregate of the second instantaneous mechanical parameter values;
- determining, for the first frequency of the alternating signal wave, a second magnitude and phase shift between the aggregate of the second instantaneous mechanical parameter values and the aggregate of the second instantaneous torque values; and
- using an aggregate of the magnitude and phase shift data and of the second magnitude and phase shift data, over the multiple frequencies, in performance of frequency response analysis to generate the bode plot fingerprint.

17. A non-transitory computer-readable storage medium that stores instructions, which when executed by a processing device of a motion controller, cause the processing device to perform a plurality of operations comprising:
- supplying a torque command to an amplifier that controls a motor, wherein the motor drives a robot linkage;
- including, in the torque command, an alternating signal wave that is to test a frequency response of the motor and the robot linkage;
- receiving, from the amplifier, an instantaneous torque value of the motor and an instantaneous position value of the robot linkage at each time step of a plurality of time steps according to a sampling rate and over a period of time;
- storing, in memory, an aggregate of the instantaneous torque values and an aggregate of the instantaneous position values;
- calculating, based on the instantaneous position values over the period of time, an aggregate of velocity values of the robot linkage;
- determining, for a first frequency of the alternating signal wave, a magnitude and phase shift between the aggregate of velocity values and the aggregate of the instantaneous torque values;
- generating, by the motion controller, a fingerprint using an aggregate of magnitude and phase shift data for multiple frequencies of the alternating signal wave; and
- performing, using the fingerprint, frequency response diagnostics of the motor and the robot linkage.

18. The non-transitory computer-readable storage medium of claim 17, wherein the fingerprint is a bode plot fingerprint, and wherein the plurality of operations further comprises:
- comparing, by the motion controller, the bode plot fingerprint with a baseline bode plot fingerprint previously generated for the motor and the robot linkage; and
- determining, based on the comparing, that one of the motor, the robot linkage, or a belt that couples the motor to the robot linkage, has a defect.

19. The non-transitory computer-readable storage medium of claim 18, wherein the plurality of operations further comprises:
- detecting a first minimum in a magnitude of the bode plot fingerprint and a second minimum of the baseline bode plot fingerprint; and
- detecting, based on the first minimum being more than a set percentage different than the second minimum, a bad inertia of the robot linkage.

20. The non-transitory computer-readable storage medium of claim 18, wherein the plurality of operations further comprises:
- detecting an increase in magnitude that terminates at a maximum magnitude in the bode plot fingerprint and in the baseline bode plot fingerprint;
- detecting a plateau in amplitude at the maximum magnitude for the bode plot fingerprint; and
- determining the defect is closed loop instability in response to detecting the plateau.

* * * * *